(12) United States Patent
Rapp et al.

(10) Patent No.: US 8,773,864 B2
(45) Date of Patent: Jul. 8, 2014

(54) ENCLOSURE ASSEMBLY HOUSING AT LEAST ONE ELECTRONIC BOARD ASSEMBLY AND SYSTEMS USING SAME

(75) Inventors: John W. Rapp, Manassas, VA (US); Nicholas J. Nagurny, Manassas, VA (US); Brent I. Gouldey, Aldie, VA (US); Mark Jones, Centreville, VA (US); Wendy S. Normark, Lorton, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 711 days.

(21) Appl. No.: 12/141,799

(22) Filed: Jun. 18, 2008

(65) Prior Publication Data

US 2010/0046177 A1 Feb. 25, 2010

(51) Int. Cl.
*H05K 5/00* (2006.01)
(52) U.S. Cl.
USPC .......................................... 361/752
(58) Field of Classification Search
USPC ......................... 361/730, 752, 796
See application file for complete search history.

(56) References Cited

U.S. PATENT DOCUMENTS

| | | | |
|---|---|---|---|
| 2,976,806 A | 3/1961 | Risk et al. | |
| 3,272,933 A | 9/1966 | Henderson | |
| 3,434,014 A | 3/1969 | Taynton R. | |
| 3,596,139 A * | 7/1971 | Walsh | 174/562 |
| 3,833,840 A | 9/1974 | Sinden | |
| 3,970,198 A | 7/1976 | Prater | |
| 4,542,442 A | 9/1985 | Drexler | |
| 4,679,872 A | 7/1987 | Coe | |
| 4,823,951 A | 4/1989 | Colomina | |
| 5,060,111 A | 10/1991 | Takashima | |
| 5,063,475 A | 11/1991 | Balan | |
| 5,105,337 A | 4/1992 | Bitller et al. | |
| 5,119,273 A | 6/1992 | Corda | |
| 5,251,097 A | 10/1993 | Simmons et al. | |
| 5,289,694 A | 3/1994 | Nordin | |
| 5,301,089 A | 4/1994 | Takashima | |
| 5,319,526 A | 6/1994 | Takashima | |
| 5,420,428 A | 5/1995 | Bullington et al. | |
| 5,552,976 A * | 9/1996 | Munro et al. | 363/39 |
| 5,604,666 A * | 2/1997 | Yoshizawa | 361/735 |
| 5,621,617 A | 4/1997 | Goss et al. | |
| 5,650,917 A | 7/1997 | Hsu | |
| 5,757,998 A | 5/1998 | Thatcher et al. | |
| 5,903,432 A | 5/1999 | McMahon | |
| 5,984,688 A | 11/1999 | Norris | |
| 6,104,611 A * | 8/2000 | Glover et al. | 361/700 |
| 6,225,559 B1 * | 5/2001 | Hubner et al. | 174/542 |
| 6,351,374 B1 * | 2/2002 | Sherry | 361/679.33 |

(Continued)

*Primary Examiner* — Lisa Lea-Edmonds
*Assistant Examiner* — Xanthia C Cunningham
(74) *Attorney, Agent, or Firm* — Graybeal Jackson LLP; Bryan A. Santarelli (57) ABSTRACT

Various embodiments of the invention relate to enclosure assemblies housing at least one electronic board assembly and systems (e.g., missiles or unmanned vehicles) that may employ such enclosure assemblies. In an embodiment, an enclosure assembly includes an enclosure having an interior surface defining an interior space and an inner diameter. At least one electronic board assembly is positioned within the interior space and includes a first peripheral edge region and an opposing second peripheral edge region. The electronic board assembly extends diametrically so that the first and second peripheral edge regions are at least proximate to the interior surface. In another embodiment, a plurality of electronic board assemblies are positioned within the interior space and each extends generally along a respective non-diametric chord defined by the interior surface.

25 Claims, 8 Drawing Sheets

(56) References Cited

U.S. PATENT DOCUMENTS

| | | |
|---|---|---|
| 6,351,383 B1 | 2/2002 | Payton |
| 6,402,031 B1 | 6/2002 | Hall |
| 6,665,182 B2 | 12/2003 | Hogerl |
| 6,735,086 B1 | 5/2004 | Weber et al. |
| 6,744,637 B2 | 6/2004 | Blazic et al. |
| 6,766,950 B2 | 7/2004 | Hall |
| 6,768,642 B2 | 7/2004 | Hines et al. |
| 6,865,085 B1 | 3/2005 | Ferris et al. |
| 6,892,646 B1 | 5/2005 | Zimmerman et al. |
| 6,894,907 B2 * | 5/2005 | Gustine et al. ............... 361/801 |
| 6,917,523 B2 | 7/2005 | Summers et al. |
| 6,976,113 B2 | 12/2005 | Krishnamurthy et al. |
| 6,983,385 B2 | 1/2006 | German et al. |
| 7,215,557 B2 | 5/2007 | Glovatsky et al. |
| 7,230,833 B1 * | 6/2007 | Sickels .......................... 361/747 |
| 7,330,354 B2 * | 2/2008 | Watanabe .................... 361/705 |
| 7,997,770 B1 * | 8/2011 | Meurer .................... 362/311.02 |
| 2002/0030973 A1 * | 3/2002 | Scafidi ......................... 361/709 |
| 2002/0166040 A1 | 11/2002 | Crane, Jr. et al. |
| 2003/0193571 A1 | 10/2003 | Schultz et al. |
| 2003/0235042 A1 | 12/2003 | Harris et al. |
| 2004/0003154 A1 | 1/2004 | Harris et al. |
| 2004/0130927 A1 | 7/2004 | Schulz et al. |
| 2004/0133763 A1 | 7/2004 | Mathur et al. |
| 2004/0136241 A1 | 7/2004 | Rapp et al. |
| 2004/0170070 A1 | 9/2004 | Rapp et al. |
| 2004/0181621 A1 | 9/2004 | Mathur et al. |
| 2004/0225802 A1 | 11/2004 | Krishnamurthy et al. |
| 2006/0085781 A1 | 4/2006 | Rapp et al. |
| 2006/0087450 A1 | 4/2006 | Schulz et al. |
| 2006/0101250 A1 | 5/2006 | Rapp et al. |
| 2006/0101307 A1 | 5/2006 | Rapp et al. |
| 2006/0123021 A1 | 6/2006 | Byers |
| 2006/0123282 A1 | 6/2006 | Gouldey et al. |
| 2006/0149920 A1 | 7/2006 | Rapp et al. |
| 2006/0230377 A1 | 10/2006 | Rapp et al. |
| 2006/0265927 A1 | 11/2006 | Rapp et al. |
| 2010/0046175 A1 | 2/2010 | Rapp et al. |
| 2010/0282057 A1 | 11/2010 | Rapp et al. |

* cited by examiner

ENCLOSURE ASSEMBLY HOUSING AT LEAST ONE ELECTRONIC BOARD ASSEMBLY AND SYSTEMS USING SAME

RELATED APPLICATIONS

This application is related to U.S. patent application entitled "Electronics Module, Enclosure Assembly Housing Same, and Related Systems and Methods" naming John W. Rapp, Nicholas J. Nagurny, Brent I. Gouldey, Mark Jones, and Wendy S. Normark as inventors, filed concurrently herewith, and incorporated herein by this reference in its entirety.

BACKGROUND

Many weapon systems, such as air-to-air missiles and torpedos, and vehicles, such as unmanned undersea vehicles ("UUVs"), include an enclosure for housing control electronics and other components. Fitting commercially available electronics, such as PCI mezzanine cards, into such weapon systems and vehicles may be difficult because the enclosures may have unusual dimensions that are specific to a particular application. For example, a torpedo or a small missile may have a cylindrical fuselage that has a diameter in the approximate range of, for example, 4 to 21 inches, for housing control electronics, a motor, propellant, a warhead, or other component.

One approach for fitting electronics into an odd-shaped enclosure has been to design custom electronics specifically configured to fit into the enclosure. For example, a disk-shaped circuit board may be designed to fit in a transverse cross-sectional interior of a tube of a specific diameter. However, such custom electronics are generally not useable in enclosures of a different configuration, and are not scaleable for smaller or larger enclosures. For example, a 4 inch diameter disk-shaped circuit board designed for a 4-inch diameter tube may not be useable in a 21-inch tube. As another example, all of the circuitry on a single 21-inch disk-shaped circuit board may not be capable of being scaled down to fit onto a single 4-inch disk-shaped circuit board, so one may need to re-design and/or re-layout the circuitry to fit on more than one circuit board in the 4-inch tube.

SUMMARY

Various embodiments of the invention relate to enclosure assemblies housing at least one electronic board assembly and systems (e.g., missiles or unmanned vehicles) that may employ such enclosure assemblies. In an embodiment, an enclosure assembly includes an enclosure having an interior surface defining an interior space and an inner diameter. At least one electronic board assembly is positioned within the interior space and includes a first peripheral edge region and an opposing second peripheral edge region. The electronic board assembly extends diametrically so that the first and second peripheral edge regions are at least proximate to the interior surface.

In another embodiment, an enclosure assembly includes an enclosure having an interior surface defining an interior space and a plurality of non-diametric chords. A plurality of electronic board assemblies are positioned within the interior space and each includes a first peripheral edge region and an opposing second peripheral edge region. Each electronic board assembly extends generally along a respective one of the non-diametric chords so that the first and second peripheral edge regions thereof are at least proximate to the interior surface.

In yet another embodiment, a system (e.g., a missile, UUV, or other unmanned vehicle) may include any of the disclosed enclosure assembly embodiments provided herein.

BRIEF DESCRIPTION OF THE DRAWINGS

The drawings illustrate various embodiments, wherein like reference numerals refer to like elements or features in different views or embodiments shown in the drawings.

DETAILED DESCRIPTION

Various embodiments of the invention relate to enclosure assemblies housing at least one electronic board assembly, and systems (e.g., missiles, UUVs, and other unmanned vehicles) that may employ such enclosure assemblies. The enclosure assemblies may house one or more electronic board assemblies of similar size and/or configuration that control the operation of such vehicles.

Figure 1:
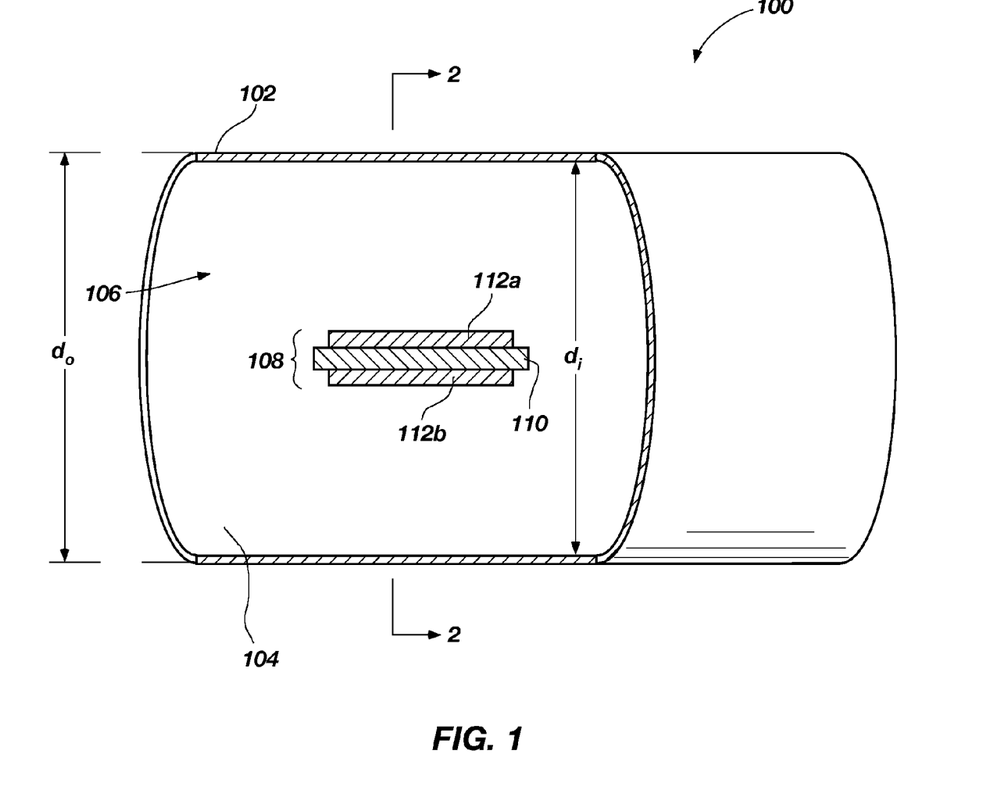
FIG. 1 is an isometric cut-away view of an enclosure assembly including a tubular enclosure that houses at least one electronic board assembly that extends diametrically therewithin according to an embodiment of the invention.
Figure 2A:
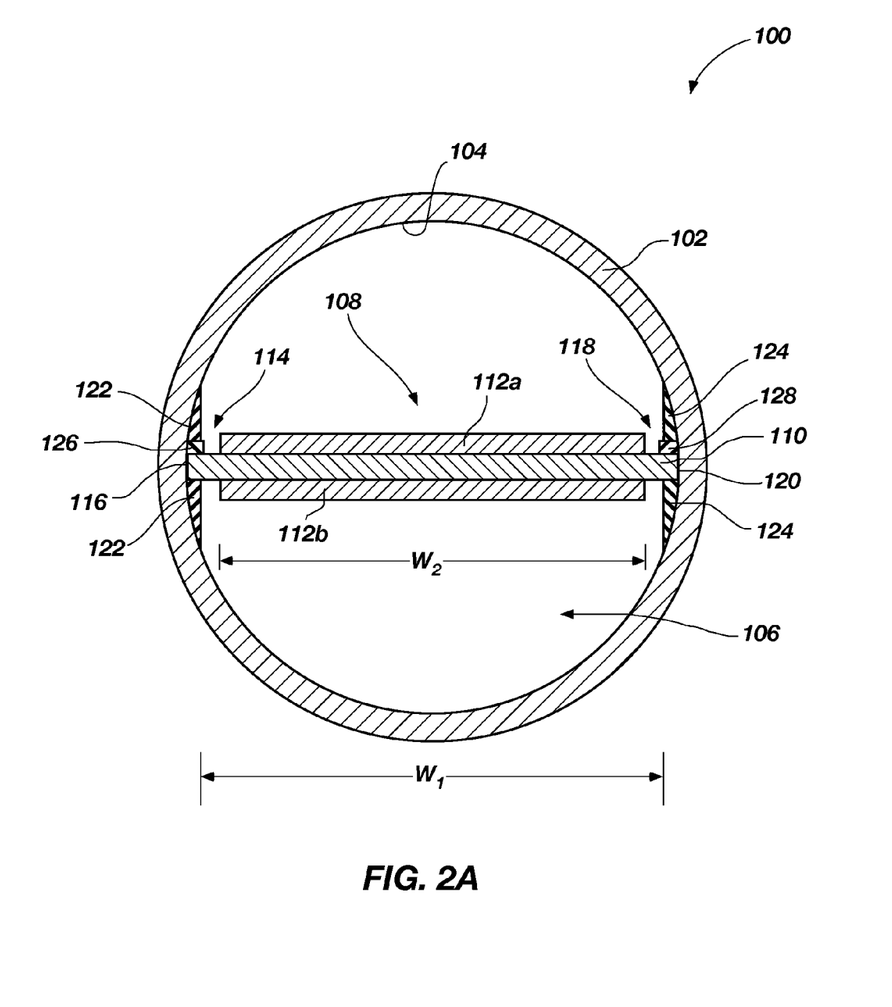
FIG. 2A is a cross-sectional view of the enclosure assembly shown in FIG. 1 taken along line 2-2.

FIG. 1 is an isometric partial cut-away view of an enclosure assembly 100 and FIG. 2A is a cross-sectional view of the enclosure assembly shown in FIG. 1 taken along line 2-2 according to an embodiment of the invention. The enclosure assembly 100 includes a generally tubular enclosure 102 having an interior surface 104 defining an interior space 106. The tubular enclosure 102 has an outer diameter $d_o$ and an inner diameter $d_i$ defined by the interior surface 104. The tubular enclosure 102 may be made from a structural material, such as steel, an aluminum alloy, a composite material, or another suitable structural material. The enclosure assembly 100 further includes at least one electronic board assembly 108 that is positioned and secured within the interior space 106 of the tubular enclosure 102, and also extends diametrically within the tubular enclosure 102.

Referring to FIG. 2A, the electronic board assembly 108 may include a carrier board 110 having a width $W_1$ that is operatively coupled to electronic circuit boards 112a and 112b mounted on opposing sides of the carrier board 110. Each electronic circuit board 112a and 112b extends generally in a plane that is substantially parallel to the plane in which the carrier board 110 extends and has a width $W_2$ that is less than that of the width $W_1$ so that electronic circuit board 112a and 112b does not physically interfere with the curved interior surface 104 of the tubular enclosure 102. External electrical connections or contacts on the carrier board 110 (e.g., for connecting to a cable (not shown)) may be provided at any suitable location and do not need to be located on a peripheral edge of the carrier board 110. There may be many different ways that the electronic board assembly 110 may be configured, and some embodiments are discussed in more detail below with respect to FIGS. 5 and 6.

Still referring to FIG. 2A, the carrier board 110 includes a first peripheral edge region 114 having a first edge 116 and an opposing second peripheral edge region 118 having a second edge 120. The width $W_1$ of the carrier board 110 extends diametrically so that the first and second edge regions 114 and 118 thereof, respectively, are at least proximate to the interior surface 104 of the tubular enclosure 102. In some embodiments, each of the first and second edges 116 and 120 may be abut or otherwise interface with the interior surface 104 of the tubular enclosure 102 for more efficient heat transfer.

Figure 2B:
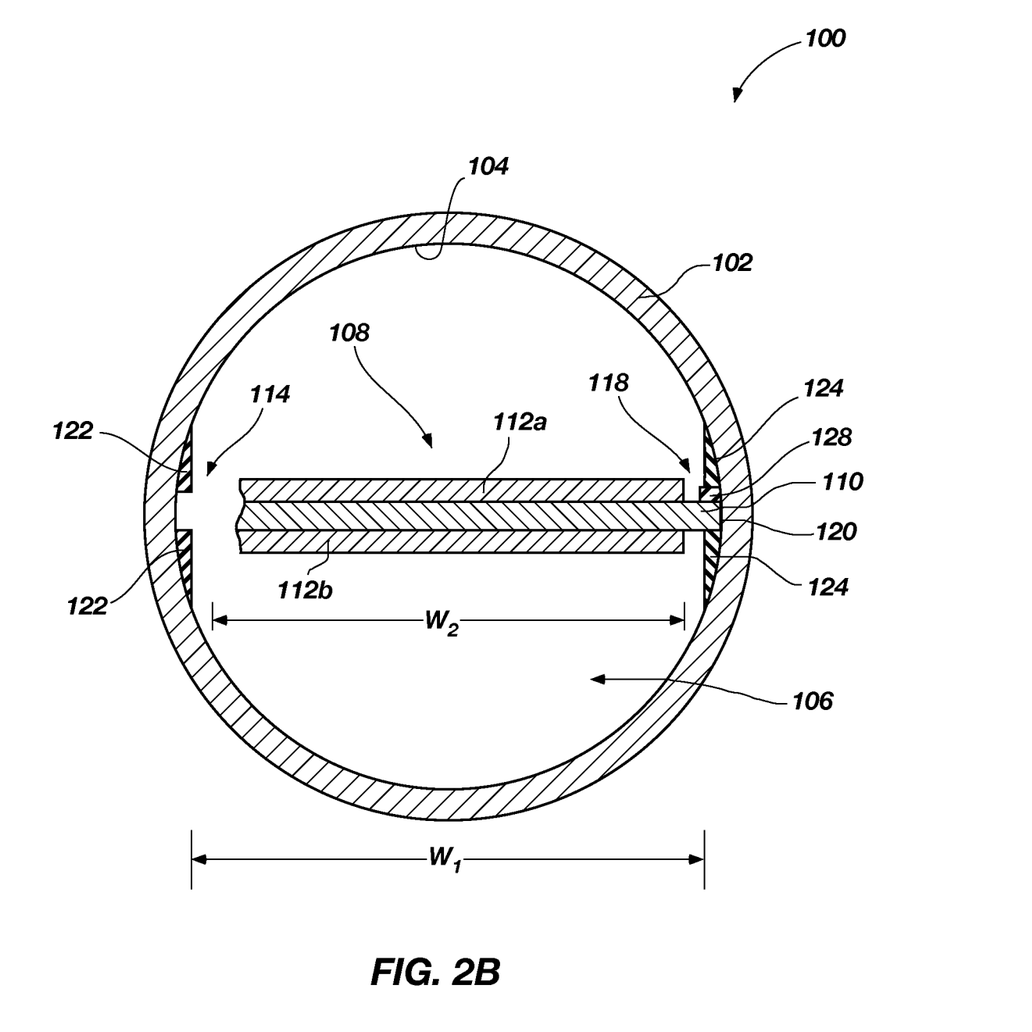
FIG. 2B is a cross-sectional view of the enclosure assembly shown in FIG. 1 taken along line 2-2, with a portion of the electronic board assembly removed.

Referring to FIGS. 2A and 2B, the enclosure assembly 100 further includes first and second mounts 122 and 124, each of which is attached to the interior surface 104 of the tubular enclosure 102 and defines a corresponding longitudinally extending slot therein. Referring specifically to FIG. 2B, for example, the first mount 122 defines a longitudinally extending slot 200. The first and second mounts 122 and 124 may be secured to the interior surface 104 of the tubular enclosure 102 by bolting, welding, or another suitable joining technique. The electronic board assembly 108 includes a first mounting device 126 attached to the first peripheral edge region 114 of the carrier board 110 and a second mounting device 128 attached to the second peripheral edge region 118 of the carrier board 110. The first and second mounting devices 126 and 128 may each be secured to the carrier board 110 using one or more fasteners, such as rivets, screws, or other suitable fasteners. The first peripheral edge region 114 and first mounting device 126 may be received in the slot defined by the first mount 122, and the first mounting device 126 is configured to controllably engage the mount 122. The second peripheral edge region 118 and second mounting device 128 may be received in the slot defined by the second mount 124, and the second mounting device is configured to controllably engage the mount 124. When engaged, the first and second mounting devices 126 and 128 secure the electronic board assembly 108 within the interior space 106 of the tubular enclosure 102.

In an embodiment, each of the first and second mounting devices 126 and 128 may be configured as a locking device that locks with a corresponding one of the mounts 122 and 124. One suitable locking device is a wedge-lock type device configured to controllably expand within respective slots defined by the corresponding mounts 122 and 124 to bear against one sidewall of the slot and compress the carrier board 110, to which it is mounted, against an opposing sidewall of the slot. For example, suitable locking devices are disclosed in U.S. Pat. Nos. 3,970,198 and 4,823,951, which are incorporated by reference, and such locking devices are commercially available from Birtcher Products of Poway, Calif.

In an embodiment, the first and second mounting devices 126 and 128 may be made from a high-thermal conductivity material, such as an aluminum alloy, a copper alloy, or another suitable material. In such an embodiment, heat generated by the electronic board assembly 110 during operation is conducted via thermal conduction to the first and second mounting devices 126 and 128, from the first and second mounting devices 126 and 128 to the corresponding first and second mounts 122 and 124, and from the first and second mounts 122 and 124 to the tubular enclosure 102. Thus, the tubular enclosure 102 may function as a "cold wall" so that heat generated by the operation of the electronic board assembly 108 is conducted outward to the tubular enclosure and, then, into the environment (e.g., air or water) surrounding the tubular enclosure to promote cooling of the electronic board assembly 108.

In another embodiment of the invention, the first and second mounts 122 and 124 may be integrally formed in the tubular enclosure 102 by forming (e.g., by machining) longitudinally extending slots that extend through the interior surface 104 and partially through the thickness of the tubular enclosure. Each longitudinally extending slot is configured to receive a corresponding one of the first and second peripheral edge regions 114 and 118 and associated mounting devices 126 and 128.

The electronic board assembly 108 may be designed to fit in the tubular enclosure 102 in which the inner diameter $d_i$ is about 4 inches. Thus, the width $W_1$ of the carrier board 110 of the electronic board assembly 108 may be about 4 inches so that it snugly fits in the tubular enclosure 102 when the inner diameter $d_i$ is about 4 inches. However, computing power may be increased by assembling a number of longitudinally distributed electronic board assemblies 108 within the interior space 106 of the tubular enclosure 102 and interconnecting them, as desired or needed for a particular application.

In practice, one or more of the electronic board assemblies 108 may be inserted into the interior space 106 of the tubular enclosure 102. As desired or needed for a particular application, the electronic board assembly 108 may be conveniently removed, and one or both of the electronic circuit boards 112a and 112b thereof may be removed for repair or replacement, for example, with a more powerful electronic board assembly or an electronic board assembly configured to perform different computing functions. Then, the electronic board assembly 108 may be re-installed having the replacement electronic circuit board.

Figure 3:
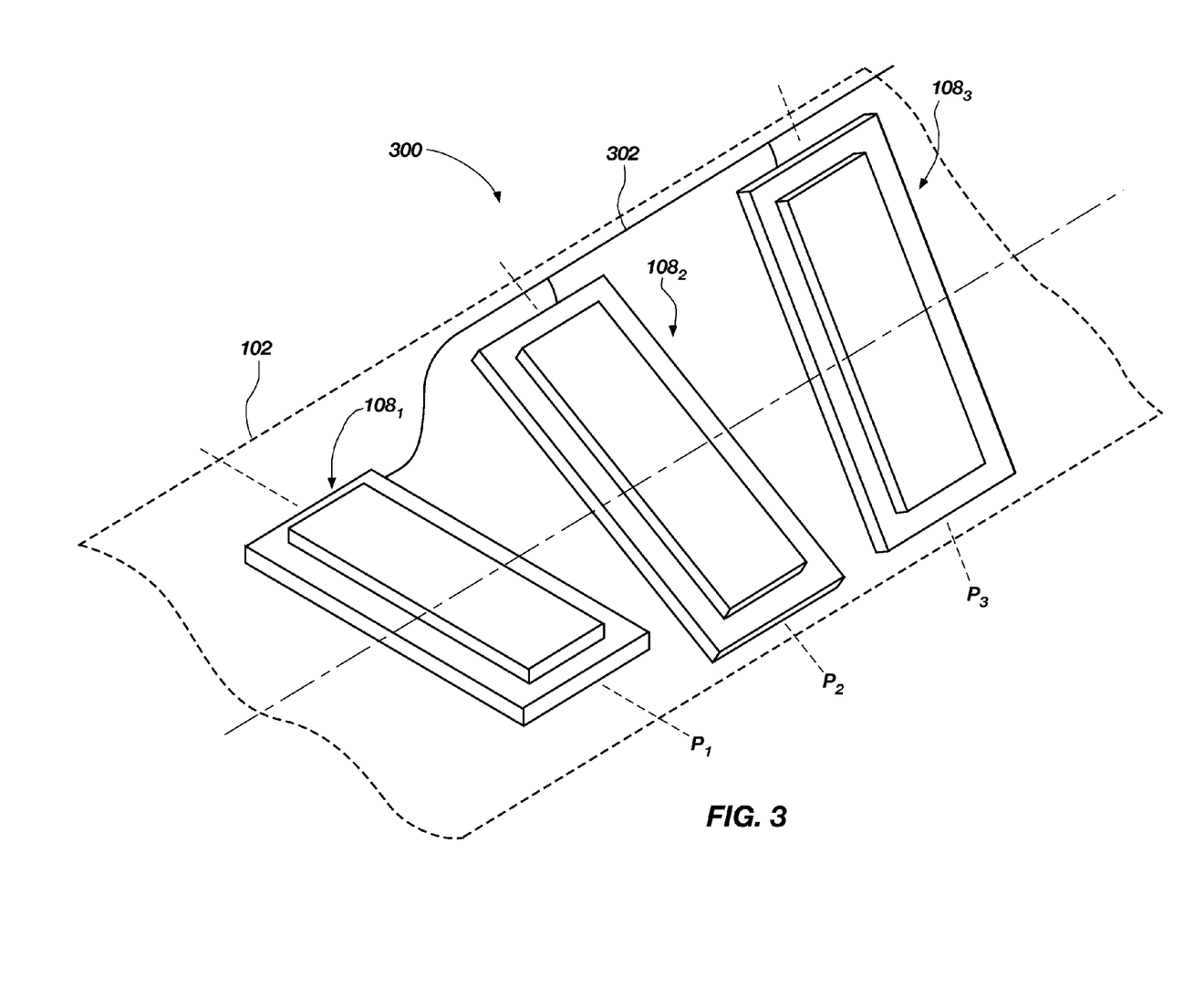
FIG. 3 is an isometric view of an enclosure assembly including a tubular enclosure housing a plurality of electronic board assemblies each of which extends diametrically within the tubular enclosure and lies in a different respective plane according to another embodiment of the invention.

FIG. 3 is an isometric view of an enclosure assembly 300 housing a plurality of electronic board assemblies $108_1$-$108_n$ that each extends diametrically within the tubular enclosure 102 and lies in a different corresponding plane $P_1$-$P_n$ according to another embodiment of the invention. For example, in the enclosure assembly 300, each electronic board assembly $108_1$-$108_3$ extends diametrically within the interior spaced 106 in a different, respective plane $P_1$-$P_3$. Each electronic board assembly $108_1$-$108_3$ may be electrically interconnected to a common wire bus 302.

Although not shown, each electronic board assembly $108_1$-$108_n$ may be mounted to the tubular enclosure 102 within the interior space 106 using pairs of mounts (e.g., the mounts 122 and 124 shown in FIGS. 2A and 2B) and pairs of mounting devices (e.g., the mounting devices 126 and 128 shown in FIGS. 2A and 2B). Mounting and orienting each electronic board assembly $108_1$-$108_3$ in different respective planes $P_1$-$P_3$, may improve heat transfer from the electronic board assemblies $108_1$-$108_3$ to the tubular enclosure 102.

Figure 4:
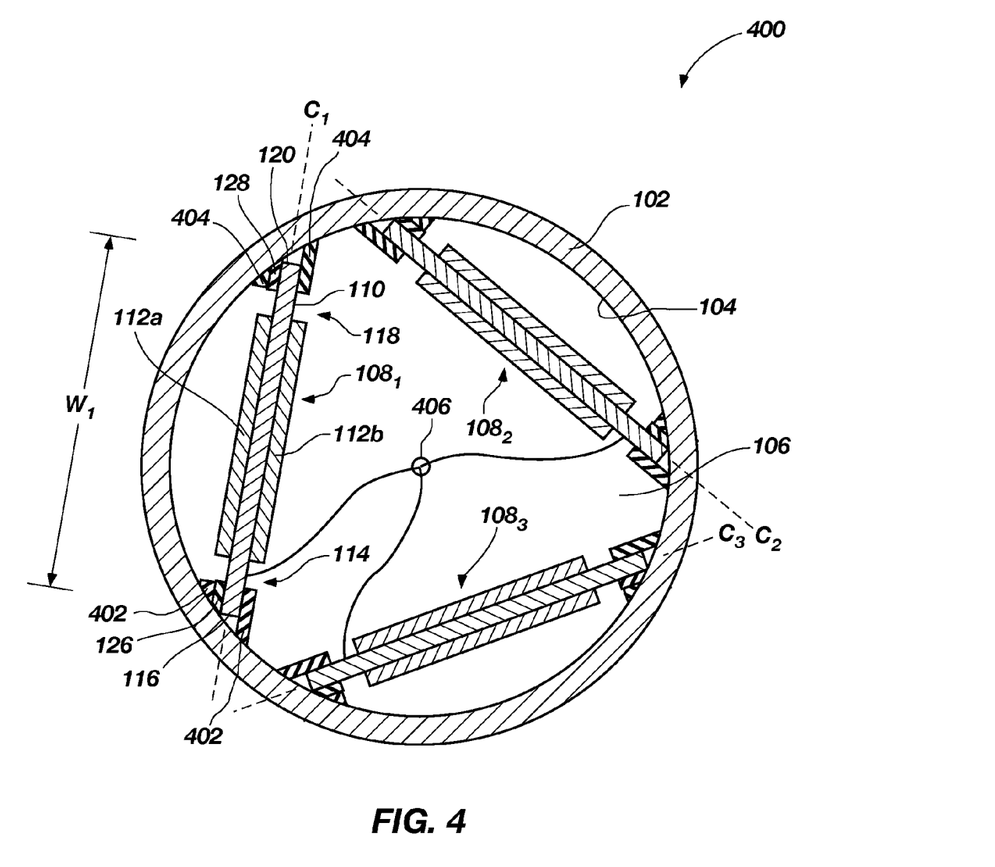
FIG. 4 is a cross-sectional view of an enclosure assembly including a tubular enclosure housing a plurality of electronic board assemblies each of which extends generally along a respective non-diametric chord defined by an interior surface of a tubular enclosure that houses the electronic board assemblies according to another embodiment of the invention.

FIG. 4 is a cross-sectional view of an enclosure assembly 400 that houses a plurality of electronic board assemblies $108_1$-$108_n$ according to another embodiment of the invention. The enclosure assembly 400 includes the electronic board assemblies $108_1$-$108_3$, each of which extends generally along a corresponding non-diametric chord $C_1$-$C_3$ defined by the interior surface 104 of the tubular enclosure 102. Each of the electronic board assemblies $108_1$-$108_3$ extends along the corresponding one of the non-diametric chords $C_1$-$C_3$ so that a corresponding first peripheral edge region 114 and mounting device 126 are received by a slot (not shown) defined by a first mount 402 and a corresponding second peripheral edge region 118 and mounting device 128 are received by a slot (not shown) received by a second mount 404. For example, each of the non-diametric chords $C_1$-$C_3$ may have a chord length at least about equal to the width $W_1$ of each electronic board assembly $108_1$-$108_3$. Each electronic board assembly $108_1$-$108_3$ may be electrically interconnected to a common wire bus 406. Although only three of the electronic board assemblies 108 are shown in FIG. 4, in other embodiments, less than or more than three of the electronic board assemblies 108 may be housed by the tubular enclosure 102 and each extends, respectively, along a different non-diametric chord depending upon the size of the inner diameter $d_i$ of the tubular enclosure 102 relative to the width $W_1$ of each electronic board assembly $108_1$-$108_3$.

The embodiment shown in FIG. 4 may be employed, for example, when the width $W_1$ of each electronic board assembly 108 is less than that of the inner diameter $d_i$. For example, in an embodiment, the width $W_1$ of each electronic board assembly 108 may be about 4 inches, and the inner diameter $d_i$ may be about 12 inches or 21 inches. In such an embodiment, a number of the electronic board assemblies 108 may be assembled and electrically interconnected together, as illustrated in FIG. 4, which are also capable of being used in an application that employs a smaller inner diameter tubular enclosure.

As with the enclosure assembly 100 shown in FIG. 1, in another embodiment, the first and second mounts 404 and 406 may be integrally formed in the tubular enclosure 102 by, for example, machining longitudinally extending slots that extend through the interior surface 104 and partially through the thickness of the tubular enclosure.

In some applications, one or more of the electronic circuit boards 112 may be removed and replaced with more computationally powerful electronic circuit boards. In such a case, one or both of the electronic circuit boards 112a and 112b of a respective electronic board assembly $118_1$-$118_n$ may be removed and not replaced because the more powerful electronic circuit boards of other electronic board assemblies 118 provide sufficient computing power for the particular application. The carrier boards 124, without having corresponding electronic circuit boards 110 thereon, may be left in the tubular enclosure 102 for convenience and also to increase the installation turn-around time.

Figure 5:
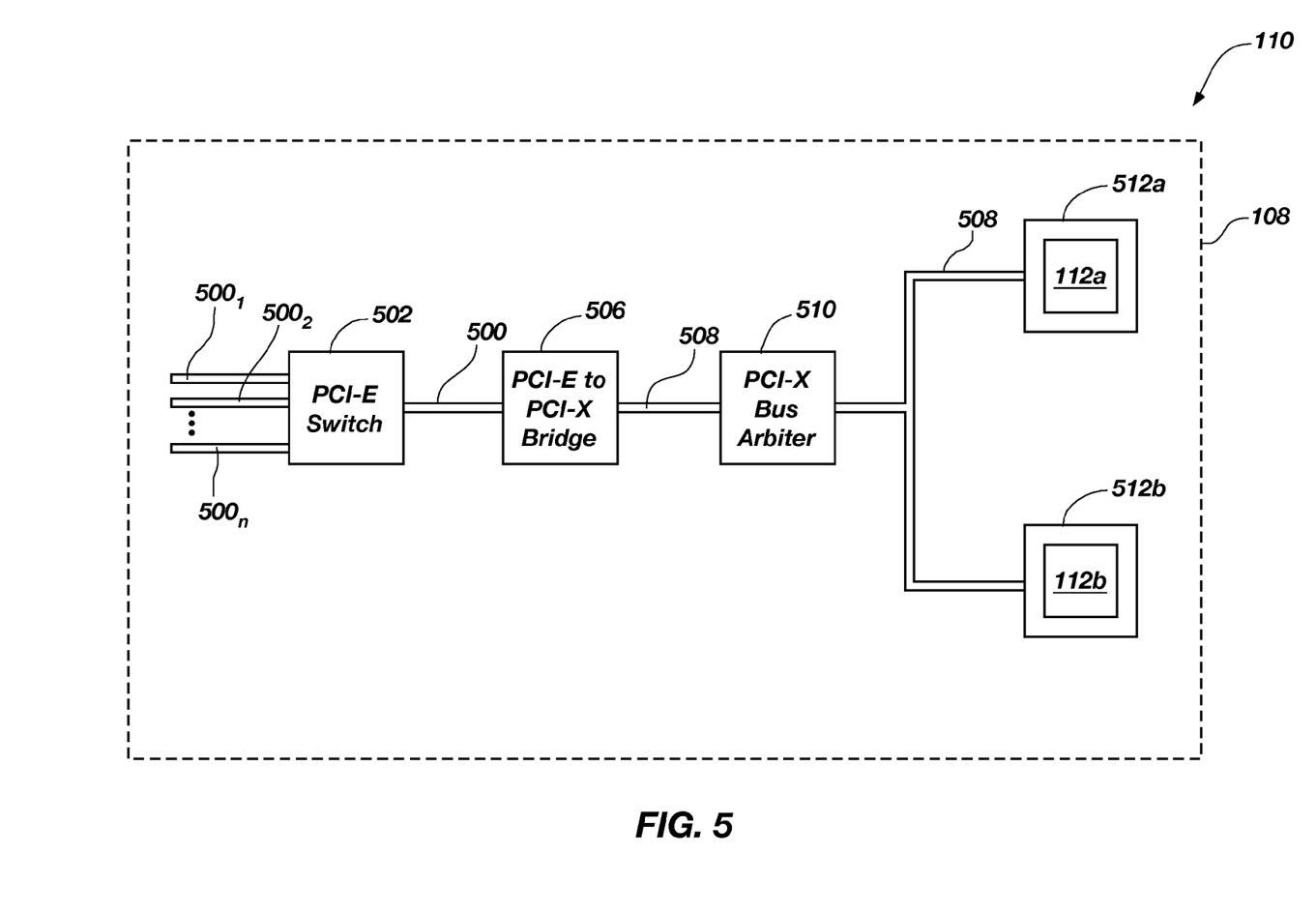
FIG. 5 is a schematic block diagram the electronic board assemblies shown in FIGS. 1-4 according to an embodiment of the invention.

FIG. 5 is a schematic block diagram of an embodiment for the electronic board assembly 108 shown in FIGS. 1-3. The carrier board 110 of the electronic board assembly 108 may include one or more busses, such as peripheral component interface ("PCI") express buses $500_1$-$500_n$, which are serial buses that each have a number of lanes (e.g., four lanes). For example, the PCI express busses $500_1$-$500_n$ may employ a serializer/deserializer commonly known as SERDES. The carrier board 110 may also include a PCI-express ("PCI-E") switch 502 coupled to the buses $500_1$-$500_n$ that functions similar to a multiplexer and is configured to selectively allow communication from one of the buses $500_1$-$500_n$ to a PCI-E-to-PCI-X bridge 506. The PCI-E-to-PCI-X bridge 506 is configured to convert the PCI-E buses $500_1$-$500_n$ to a PCI-X bus 508.

Still referring to FIG. 5, the carrier board 110 further includes a PCI-X bus arbiter 510 coupled to the PCI-E-to-PCI-X bridge 506 via the PCI-X bus 508. The carrier board 110 further includes two board slots 512a and 512b, each of which may be positioned on an opposing side of the carrier board 110 and coupled to the PCI-X bus arbiter 510 via the PCI-X bus 508. The electronic circuit board 112a is inserted into the board slot 512a and operatively coupled to the PCI-X bus arbiter 510, and the electronic circuit board 112b is inserted into the board slot 512b and operatively coupled to the PCI-X bus arbiter 510. One, two, four, eight, sixteen, or thirty-two lanes of data may be transmitted from the carrier board 110 to the electronic circuit boards 112a and 112b. For example, the PCI-X bus arbiter 510 is configured to selectively connect the electronic circuit boards 112a or 112b to the PCI-X bus 508 at any give time to enable communication with another device remote from the carrier board 110, such as another electronic circuit board 112 on another electronic board assembly 108.

In some embodiments, one or more of the electronic circuit boards 112a and 112b may be a PCI mezzanine board (also known as a PMC card). However, it is noted that the use of PCI mezzanine boards is merely one example, and many different off-the-shelf cards having formats other than the PCI mezzanine boards may be used.

Figure 6:
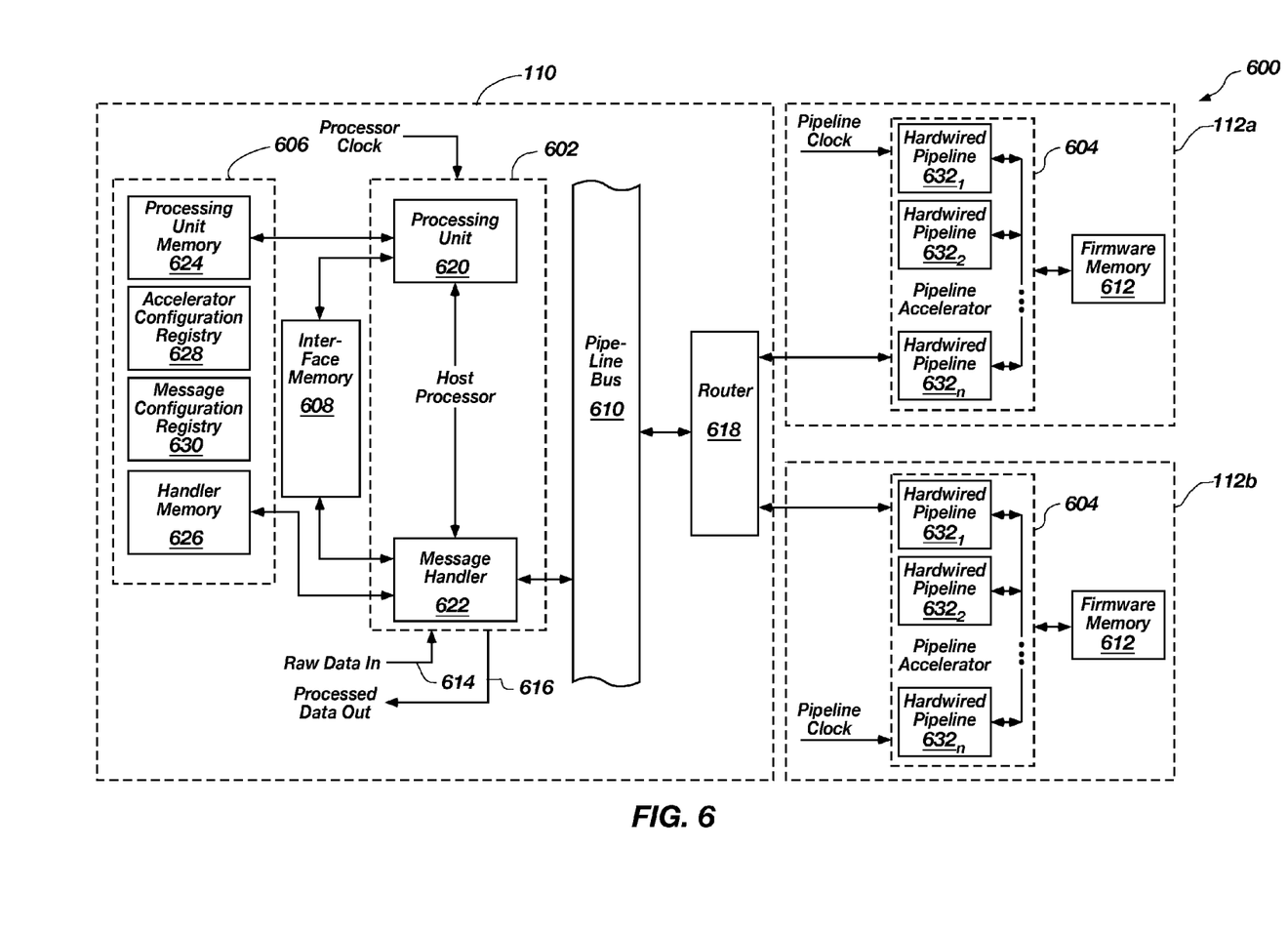
FIG. 6 is a schematic block diagram of an embodiment of the invention in which the electronic board assembly shown in FIGS. 1-4 is configured as a peer-vector computing machine.

Referring to the schematic block diagram of FIG. 6, in another embodiment of the invention, the electronic board assembly 108 may be configured as a peer-vector computing machine 600. As an example, the peer-vector computing machine 600 may be sufficiently powerful to provide processing power for a control system (not shown in FIG. 6) of a system, such as a missile or other unmanned vehicle, yet sufficiently small and energy efficient so that multiple peer-vector computing machines 600 may be installed in, for example, the tubular enclosure 102 and run off of the vehicle's power-supply system (not shown in FIG. 6), which may be a battery.

Still referring to FIG. 6, the carrier board 110 includes a host processor 602 and each of the electronic circuit boards 112a and 112b includes a respective pipeline accelerator 604 that is operable to process at least a portion of the data processed by the peer-vector computing machine 600. Therefore, the host-processor 602 and the accelerators 604 are "peers" that may transfer data messages back and forth. Because each accelerator 604 includes hardwired logic circuits instantiated on one or more programmable-logic integrated circuits ("PLICs"), it executes few, if any, program instructions in the traditional sense (e.g., fetch an instruction, load the fetched instruction into an instruction register), and thus typically performs mathematically intensive operations on data significantly faster than a bank of instruction-executing computer processors can for a given clock frequency. Consequently, by combining the decision-making ability of the processor 602 and the number-crunching ability of the accelerators 604, the peer-vector computing machine 600 has the same abilities as, but can often process data faster than, a conventional processor-based computing machine. Furthermore, as discussed in U.S. Patent Publication No. 2004/0136241, which is incorporated by reference, providing each accelerator 604 with a communication interface that is compatible with the interface of the host processor 602 facilitates the design and modification of the peer-vector computing machine 600, particularly where the communication interface is an industry standard. In addition, for a given data-processing power, the peer-vector computing machine 600 is often smaller and more energy efficient than a processor-based computing machine. Moreover, the peer-vector computing machine 600 may also provide other advantages as described in the following other patent publications and applications, which are incorporated by reference: Publication Nos. 2004/0130927, 2004/

0133763, 2004/0170070, 2004/0181621, 2006/0085781, 2006/0087450, 2006/0101250, 2006/0101253, 2006/0101307, 2006/0123282, 2006/0149920, and 2006/0230377.

Still referring to FIG. 6, in addition to the host processor 602, the carrier board 110 of the peer-vector computing machine 600 also includes a processor memory 606, an interface memory 608, a pipeline bus 610, a firmware memory 612, an optional raw-data input port 614, an optional processed-data output port 616, and an optional router 618. The host processor 602 further includes a processing unit 620 and a message handler 622, and the processor memory 606 includes a processing-unit memory 624 and a handler memory 626, which respectively serve as both program and working memories for the processor unit and the message handler. The processor memory 624 also includes an accelerator-configuration registry 628 and a message-configuration registry 630, which store respective configuration data that allow the host processor 602 to configure the functioning of each accelerator 604 and the structure of the messages that the message handler 626 sends and receives.

The pipeline accelerator 604 of each of the electronic circuit boards 112a and 112b includes at least one PLIC, such as a field-programmable gate array ("FPGA"), on which are disposed hardwired pipelines $632_1$-$632_n$, which process respective data while executing few, if any, program instructions in the traditional sense. The firmware memory 612 of each of the electronic circuit boards 112a and 112b stores the configuration firmware for the PLIC(s) of the accelerator 604. The accelerator 604 is discussed further in previously incorporated U.S. Patent Publication Nos. 2004/0130927, 2004/0136241, and 2004/0181621.

Generally, in one mode of operation of the peer-vector computing machine 600, respective pipelined accelerators 604 of the electronic circuit boards 112a and 112b receive data from one or more software applications running on the host processor 602, process this data in a pipelined fashion with one or more logic circuits that execute one or more mathematical algorithms, and then return the resulting data to the application(s). As stated above, because the logic circuits execute few if any software instructions in the traditional sense, they often process data one or more orders of magnitude faster than the host processor 602. Furthermore, because the logic circuits are instantiated on one or more PLICs, one can modify these circuits merely by modifying the firmware stored in the memory 612. That is, one need not modify the hardware components of the accelerators 604 or the interconnections between these components. The operation of the peer-vector machine 600 is further discussed in previously incorporated U.S. Patent Publication No. 2004/0133763, the functional topology and operation of the host processor 602 is further discussed in previously incorporated U.S. Patent Publication No. 2004/0181621, and the topology and operation of the accelerator 604 is further discussed in previously incorporated U.S. Patent Publication No. 2004/0136241.

Referring again to FIGS. 3 and 4, the electronic board assemblies 108 may be electrically interconnected in various manners to perform different computing functions. In an embodiment, the electronic board assemblies 108 may be coupled in series (i.e., "daisy chained" together) via cable connections between respective PCI-E switches 502 (FIG. 5) or host processors 602 (FIG. 6) to enable one or more of the electronic circuit boards 112 to communicate with electronic circuit boards 112 of another electronic board assembly 108. In such an embodiment, communication between two of the electronic circuit boards 112 of different electronic board assemblies 108 may be routed through the PCI-E switches 502 or host processor(s) 602 of the intervening electronic board assemblies 108. In an embodiment, a common cable bus may be provided and the PCI-E switches 502 or host processors 602 of each electronic board assembly 108 may be electrically connected to the common cable bus in parallel.

Figure 7:
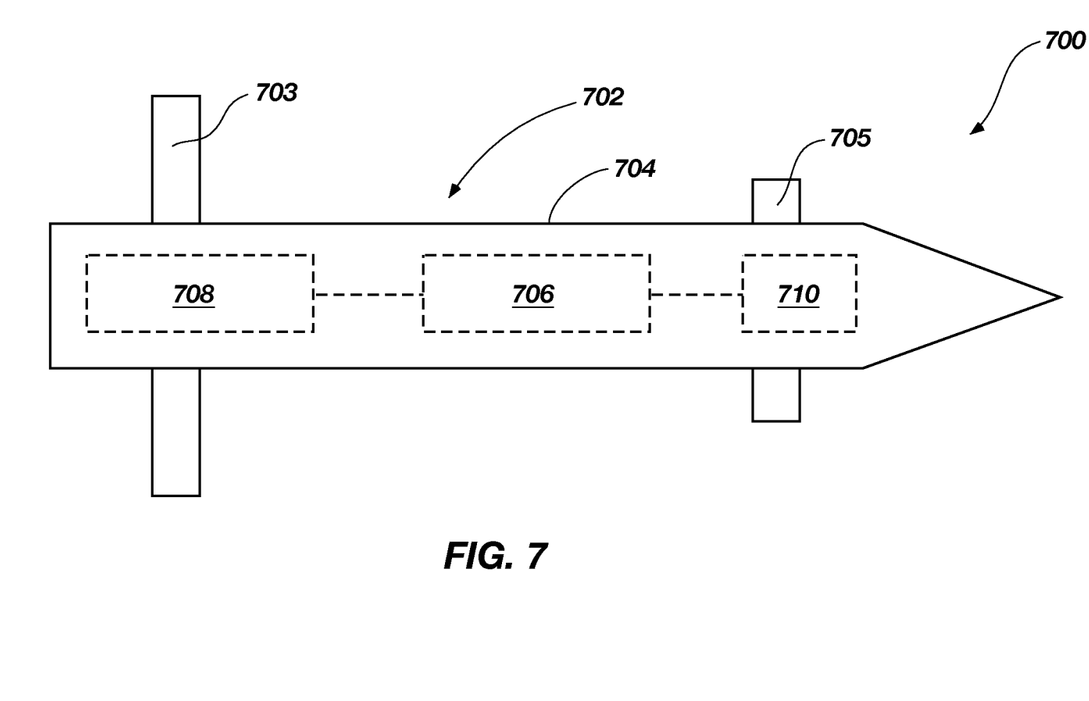
FIG. 7 is schematic diagram of a system, such as an UUV, including any of the disclosed enclosure assembly embodiments according to an embodiment of the invention.

Referring to FIG. 7, the described enclosure assemblies having at least one electronic board assembly may be employed in a variety of different applications. FIG. 7 is schematic diagram of a system 700 according to an embodiment. For example, the system 700 may be configured as an UUV. The system 700 includes an enclosure assembly 702 having a tubular enclosure 704 (i.e., a vehicle body) in which at least one electronic board assembly 706 is installed according to the teachings of any of the disclosed embodiments. The electronic board assembly 706 may employed for controlling the operation of any of the UUVs disclosed in U.S. Patent Publication No. 2006/0265927 and U.S. patent application Ser. No. 12/008,487, each of which is incorporated by this reference.

Still referring to FIG. 7, the tubular enclosure 704 may include rear control fins 703 projecting outwardly therefrom and front control fins 705. For example, the tubular enclosure 704 and electronic board assembly 706 may be configured as any of the previously described embodiments. The electronic board assembly 706 may be operatively coupled to a propulsion unit 708 (e.g., a motor), an optional warhead 710, and an actuation system (not shown) operable to controllably move the rear and front fins 703 and 705 to help direct the system 700, all of which reside in the tubular enclosure 704. The electronic board assembly 706 is configured to control the operation of the propulsion unit 708, the actuation system, and, if applicable, detonation of the warhead 710. Although not shown in FIG. 7, in addition to the electronic board assembly 706 being configured to control the propulsion unit 708, the electronic board assembly 706 may also be configured to control a variety of different units housed by tubular enclosure 704, such as sensors, cameras, etc.

In other embodiments, the described enclosure assemblies having at least one electronic board assembly may be employed in a missile, such as a torpedo, a ground-to-air missile, an air-to-ground missile, a ground-to-ground missile, or any other suitable application. Further applications include space craft or any other vehicle having an enclosure that can fit an electronics module as described herein.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the invention. Thus, the invention is not intended to be limited to the embodiments shown, but is to be accorded the widest scope consistent with the principles and features disclosed herein.

The invention claimed is:

1. An enclosure assembly, comprising:
an enclosure including an interior surface defining an interior space and an inner diameter; and
at least one electronic board assembly positioned within the interior space and including a first peripheral edge region and an opposing second peripheral edge region, the at least one electronic board assembly extending diametrically so that the first and second peripheral edge regions are at least proximate to the interior surface, the electronic board assembly comprising a PCI mezzanine board having a PCI bus interface wherein the first and second peripheral edge regions comprise edges other than the PCI bus interface.

2. The enclosure assembly of claim 1 wherein at least one electronic board assembly comprises a plurality of electronic board assemblies longitudinally spaced and each including a corresponding first peripheral edge region and a corresponding opposing second peripheral edge region, each electronic board assembly generally lying in a different plane and extending diametrically so that each corresponding first peripheral edge region and each corresponding opposing second peripheral edge region is at least proximate to the interior surface.

3. The enclosure assembly of claim 1 wherein the interior surface comprises first and second longitudinally extending slots formed therethrough, the first peripheral edge region of the at least one electronic board assembly inserted into the corresponding first longitudinally extending slot and the second peripheral edge region of the at least one electronic board assembly inserted into the corresponding second longitudinally extending slot.

4. The enclosure assembly of claim 3 wherein the at least one electronic board assembly comprises:
a first locking device attached to the first peripheral edge region, and received by and locked within the first longitudinally extending slot; and
a second locking device attached to the second peripheral edge region, and received by and locked within the second longitudinally extending slot.

5. The enclosure assembly of claim 1 wherein the at least one electronic board assembly comprises:
a first mounting device attached to the first peripheral edge region that engages a first mount associated with the enclosure; and
a second mounting device attached to the second peripheral edge region that engages a second mount associated with the enclosure.

6. The enclosure assembly of claim 1 wherein the inner diameter of the enclosure is about 4 inch.

7. The enclosure assembly of claim 1 wherein the at least electronic board assembly comprises external electrical connectors that are not located within a peripheral edge region thereof.

8. The enclosure assembly of claim 1 wherein the at least one electronic board assembly comprises:
a carrier substrate including a first side and an opposing second side;
a first electronic circuit board mounted to the first side and operatively coupled to the carrier substrate; and
a second electronic circuit board mounted to the second side and operatively coupled to the carrier substrate.

9. The enclosure assembly of claim 8 wherein:
the first electronic circuit board comprises the PCU mezzanine board as a first PCI mezzanine board; and
the second electronic circuit board comprises a second PCI mezzanine board.

10. The enclosure assembly of claim 1 wherein the at least one electronic board assembly comprises:
a carrier board including a first side and an opposing second side;
a first electronic circuit board mounted to the first side of the carrier board and operatively coupled to the carrier board, the first electronic circuit board including a first pipeline accelerator; and
a second electronic circuit board mounted to the second side of the carrier board and operatively coupled to the carrier board, the second electronic circuit board including a second pipeline accelerator.

11. An enclosure assembly, comprising: an enclosure including an interior surface defining an interior space and a plurality of non-diametric chords; and a plurality of electronic board assemblies positioned within the interior space and each including a first peripheral edge region having a high-thermal conductivity interface and an opposing second peripheral edge region having a high-thermal conductivity interface, each electronic board assembly extending generally along a respective one of the non-diametric chords so that the first and second peripheral edge regions thereof are interface with the interior surface such that heat is transferred from the plurality of electronic board assemblies to the enclosure; wherein each electronic board assembly further comprises a PCI mezzanine board having a PCI bus interface wherein the first and second peripheral edge regions comprise edges other than the PCI bus interface.

12. The enclosure assembly of claim 11 wherein the interior surface comprises a plurality of longitudinally extending slots formed therethrough, the first peripheral edge region of each electronic board assembly inserted into a respective one of the longitudinally extending slots and the second peripheral edge region of each electronic board assembly inserted into a respective one of the longitudinally extending slots.

13. The enclosure assembly of claim 11 wherein each electronic board assembly comprises:
a first locking device attached to the first peripheral edge region, and received by and locked within the first longitudinally extending slot; and
a second locking device attached to the second peripheral edge region, and received by and locked within the second longitudinally extending slot.

14. The enclosure assembly of claim 11 wherein each electronic board assembly comprises:
a first mounting device attached to the first peripheral edge region that engages a first mount associated with the enclosure; and
a second mounting device attached to the second opposing peripheral edge region that engages a second mount associated with the enclosure.

15. The enclosure assembly of claim 11 wherein the interior surface of the enclosure defines an inner diameter that is greater than about 4 inch.

16. The enclosure assembly of claim 11 wherein each electronic board assembly comprises external electrical connectors that are not located within a peripheral edge region thereof.

17. The enclosure assembly of claim 11 wherein the at least one electronic board assembly comprises:
a carrier substrate including a first side and an opposing second side;
a first electronic circuit board mounted to the first side and operatively coupled to the carrier substrate; and
a second electronic circuit board mounted to the second side and operatively coupled to the carrier substrate.

18. The enclosure assembly of claim 17 wherein:
the first electronic circuit board comprises a first PCI mezzanine board; and
the second electronic circuit board comprises a second PCI mezzanine board.

19. The enclosure assembly of claim 11 wherein the at least one electronic board assembly comprises:
a carrier board including a first side and an opposing second side;
a first electronic circuit board mounted to the first side of the carrier board and operatively coupled to the carrier board, the first electronic circuit board including a first pipeline accelerator; and
a second electronic circuit board mounted to the second side of the carrier board and operatively coupled to the carrier board, the second electronic circuit board including a second pipeline accelerator.

20. A system, comprising:
an enclosure assembly including:
  an enclosure including an interior surface defining an interior space and an inner diameter; and
  at least one electronic board assembly positioned within the interior space and including a first peripheral edge region and an opposing second peripheral edge region, the at least one electronic board assembly extending diametrically so that the first and second peripheral edge regions are extended through the interior surface; and
a propulsion system operatively coupled to the at least one electronics module.

21. The system of claim 20 wherein the enclosure forms at least part of a missile body.

22. The system of claim 20 wherein the enclosure forms at least part of a vehicle body.

23. A system, comprising:
an enclosure assembly including:
  an enclosure including an interior surface defining an interior space and a plurality of non-diametric chords; and
  a plurality of electronic board assemblies each including a first peripheral edge region and an opposing second peripheral edge region, each electronic board assembly extending generally along a respective one of the non-diametric chords so that the first and second peripheral edge regions thereof are extended through the interior surface; and
a propulsion system operatively coupled to the at least one electronics module.

24. The system of claim 23 wherein the enclosure forms at least part of a missile body.

25. The system of claim 23 wherein the enclosure forms at least part of a vehicle body.

* * * * *